US007640143B2

(12) United States Patent
Bittner et al.

(10) Patent No.: US 7,640,143 B2
(45) Date of Patent: Dec. 29, 2009

(54) CIRCUIT STATISTICAL MODELING FOR PARTIALLY CORRELATED MODEL PARAMETERS

(75) Inventors: Calvin J. Bittner, Essex Junction, VT (US); Steven A. Grundon, Underhill, VT (US); Yoo-Mi Lee, Essex Junction, VT (US); Ning Lu, Essex Junction, VT (US); Josef S. Watts, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 755 days.

(21) Appl. No.: 10/904,307

(22) Filed: Nov. 3, 2004

(65) Prior Publication Data

US 2006/0100873 A1    May 11, 2006

(51) Int. Cl.
*G06F 17/10* (2006.01)
*G06F 17/50* (2006.01)
(52) U.S. Cl. ............................................. 703/2; 703/14
(58) Field of Classification Search ..................... 703/2, 703/14
See application file for complete search history.

(56) References Cited

OTHER PUBLICATIONS

Camelio et al.; Compliant Assembly Variation Analysis Using Component Geometric Covariance; Journal of Manufacturing Science and Engineering; pp. 355-360; May 2004.*

Slezak, J,. et al., "On the Correlations Between Model Process Parameters in Statistical Modeling," NSTI-Nanotech 2004, www.nsti.org, ISBN 0-9728422 8-4, vol. 2, 2004, pp. 144-146.
Singhal, K,. et al., "Statistical Device Models From Worst Case Files and Electrical Test Data," IEEE Transactions on Semiconductor Manufacturing, vol. 12, No. 4, Nov. 1999, pp. 470-484.
Jess, J. A. G., et al., "Statistical Timing for Parametric Yield Prediction of Digital Integrated Circuits," Annual ACM IEEE Design Automation Conference, Proceedings of the $40^{th}$ Conference on Design Automation, Anaheim, CA, Jun. 2003, pp. 932-937.
Stadlober, E., et al., "Simulation Models for Robust Design Using Location Depth Methods," Quality and Reliability Engineering International, vol. 19, 2003, pp. 317-326.

* cited by examiner

*Primary Examiner*—Hugh Jones
(74) *Attorney, Agent, or Firm*—Richard Kotulak; Hoffman Warnick LLC (57) ABSTRACT

A method, system and program product are disclosed for statistical modeling an integrated circuit that provides information about partial correlations between model parameters. The invention determines a variance-covariance matrix for data to be modeled; conducts principal component analysis on the variance-covariance matrix; and creates a statistical model with an independent distribution for each principal component, allowing calculation of each individual model parameter as a weighted sum by a circuit simulator. The statistical model provides information about how well individual transistors will track one another based on layout similarity. This allows the designer to quantify and take advantage of design practices that make all transistors similar, for example, by orienting all gates in the same direction. A method, system and program product for simulating a circuit using the statistical model are also included.

9 Claims, 5 Drawing Sheets

CIRCUIT STATISTICAL MODELING FOR PARTIALLY CORRELATED MODEL PARAMETERS

BACKGROUND OF THE INVENTION

1. Technical Field

The present invention relates generally to integrated circuit design, and more particularly, to a method, system and program product for statistically modeling a circuit relative to processing, and especially random dopant variation.

2. Related Art

All integrated circuit (IC) manufacturing lines are subject to random variation in process conditions that cause random variation in the chips produced. Chips of the same design will differ in random ways, and within a single chip, transistors of the same design will differ in random ways. In order to ensure that a design will function correctly when manufactured, the designer needs to simulate the range of expected variations during the design process. The simplest and most common approach to this problem is to simulate a small set of extreme "corner" model parameters. In this approach, several models that represent extremes of process variations are tested. Typically, five corners are defined in which particular settings for NFETs and PFETs speeds are made: TT=typical NFET and PFET, FF=fast NFET and fast PFET, SS=slow NFET and slow PFET, FS=fast NFET and slow PFET and SF=slow NFET and fast PFET. The fast and slow settings are typically generated by using a value that is mean plus or minus some multiple of standard deviation. Unfortunately, this approach does not provide the ability to customize the corners to individual circuit sensitivities. For example, some circuits are more sensitive to process variations that affect threshold voltage (Vt) than to those that affect channel length. For example, in analog circuits where different transistors perform different functions, a larger set of corners is typically required to ensure all circuit requirements are met. For circuits that depend on matching between devices, it may be necessary to skew different devices in different ways within the same simulation. For some complicated circuits it may not be possible to anticipate which of the infinite possible combinations of parameter skews will be limiting cases for all of the circuit characteristics of interest.

One approach to address the above-identified problem has been to implement a Monte Carlo model in which random test cases are generated. In this model, some model parameters are specified as a distribution, typically a Guassian distribution with a specified mean, and standard deviation. The best conventional Monte Carlo models provide correlation between parameters by specifying multiple parameters using a single distribution. For example, per edge delta channel length (lint) for several different FET types may be specified by a single distribution. In this case, each parameter can have its own mean and standard deviation: $P_i=P_j$, nom+$P_i$, tol*x, where x is a normally distributed variable with a mean of zero and standard deviation of 1. Unfortunately, this approach requires a careful description of the process variations and the correlations between them so that a full range of variations is explored without testing cases that are impossible, e.g., longest possible PFETs and shortest possible NFETs, which are incompatible due to their required lithography processes. This approach also does not allow representation of situations where only partial correlations between model parameters exist. Providing the multitude of run cycles necessary to consider all of the possible partial correlations makes run times excessive. Accordingly, conventional Monte Carlo approaches cannot be used for most circuit design work.

To provide some further functionality, some conventional Monte Carlo models use a "corner" model of some type with fixed corners, or a model with a set of user controllable model parameters so that the model parameters can be moved about in the process variation space. The best corner models typically include several user settable model parameters and each Monte Carlo distribution is assigned to exactly one of the user controllable corner parameters. However, these models still do not adequately represent situations where only partial correlations between model parameters exist.

Another challenge is modeling parameters that cannot be directly measured. One particular model parameter that cannot be directly measured but is increasingly becoming problematic relative to process scaling for advanced complementary metal-oxide semiconductor (CMOS) technologies is local fluctuation (i.e., mismatch variation) of the threshold voltage (Vt) and channel current (IDS). Local fluctuations increase as the device becomes smaller. Some of the main causes of local fluctuation are the randomness of doping variation, local variation of the geometries such as a gate oxide thickness, and the effective channel length and width. These physical causes make the fluctuation of threshold voltage (Vt) and channel current (IDS) larger in smaller devices. Because the physical causes are correlated to the statistical nature of ion implantation, it is not possible to eliminate these variations. As a result, circuit designers are faced with less design margin with continued miniaturization because the threshold voltages (Vt) are not scalable as much as others, which increases the ratio of the threshold voltage (Vt) variation to supply voltage (VDD). Due to the nature of the fluctuation and continued scaling, more accurate modeling of this random local fluctuation is increasingly critical in predicting circuit performance.

Conventionally, the spice-based compact modeling for the random fluctuation of threshold voltage (Vt) and channel current (IDS) is focused on the dependency of the variation on the device's geometry. But, based on the aforementioned physical causes, there exists a strong correlation between the fluctuations of threshold voltage (Vt) and channel current (IDS) in different bias conditions, or between threshold voltages (Vt) and channel current (IDS). Currently, no methodology exists to introduce the correlation between the fluctuations of threshold voltage (Vt) and channel current (IDS) into the model in addition to the geometry dependent variation. Consequently, the assumption that variations are uncorrelated results in pessimistic predictions in the variation. In addition, conventional spice-based compact modeling does not provide mathematical relationships to the physical process variations.

In view of the foregoing, a need exists in the art for an improved modeling approach.

SUMMARY OF THE INVENTION

The invention includes a method, system and program product for statistical modeling an integrated circuit that provides information about partial correlations between model parameters. The invention determines a variance-covariance matrix for data to be modeled; conducts principal component analysis on the variance-covariance matrix; and creates a statistical model with an independent distribution for each principal component, allowing calculation of each individual model parameter as a weighted sum by a circuit simulator. The statistical model provides information about how well individual transistors will track one another based on layout similarity. This allows the designer to quantify and take advantage of design practices that make all transistors similar, for example, by orienting all gates in the same direction. A method, system and program product for simulating a circuit using the statistical model are also included.

A first aspect of the invention is directed to a method of statistically modeling integrated circuits using model parameters, comprising the steps of: determining a variance-covariance matrix for data to be modeled; conducting principal component analysis on the variance-covariance matrix; and creating a statistical model with an independent distribution for each principal component, allowing calculation of each individual model parameter as a weighted sum.

A second aspect of the invention is directed to a system for statistically modeling integrated circuits using model parameters, comprising the steps of: means for determining a variance-covariance matrix for data to be modeled; means for conducting principal component analysis on the variance-covariance matrix; and means for creating a statistical model with an independent distribution for each principal component, allowing calculation of each individual model parameter as a weighted sum.

A third aspect of the invention is directed to a computer program product comprising a computer useable medium having computer readable program code embodied therein for statistically modeling integrated circuits using model parameters, the program product comprising: program code configured to determine a variance-covariance matrix for data to be modeled; program code configured to conduct a principal component analysis on the variance-covariance matrix; and program code configured to create a statistical model with an independent distribution for each principal component, allowing calculation of each individual model parameter as a weighted sum.

A fourth aspect of the invention is directed to a method of simulating a circuit, the method comprising the steps of: calculating each of a plurality of model parameters as a weighted sum based on a statistical model, wherein the statistical model is based on a principal component analysis of a variance-covariance matrix for data to be modeled and includes an independent distribution for each principal component; and simulating circuit operation using the plurality of model parameters.

A fifth aspect of the invention includes a circuit simulator for simulating a circuit, the simulator comprising: means for calculating each of a plurality model parameters as a weighted sum based on a statistical model, wherein the statistical model is based on a principal component analysis of a variance-covariance matrix for data to be modeled and includes an independent distribution for each principal component; and means for simulating circuit operation using the plurality of model parameters.

A sixth aspect of the invention includes a computer program product comprising a computer useable medium having computer readable program code embodied therein for simulating a circuit, the program product comprising: program code configured to calculate each of a plurality of model parameters as a weighted sum based on a statistical model, wherein the statistical model is based on a principal component analysis of a variance-covariance matrix for data to be modeled and includes an independent distribution for each principal component; and program code configured to simulate circuit operation using the plurality of model parameters.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

For purposes of clarity only, the description includes the following headings: I. System Overview, II. Operational Methodology, A. Partial Correlation of Variations, 1. Introduction, 2. Model Parameters Directly Measurable, 3. Model Parameters Not Directly Measurable, B. Simulation, 1. Partial Correlations, 2. Corner Analysis, 3. Layout Dependent Variations; and III. Conclusion.

I. SYSTEM OVERVIEW

Figure 1:
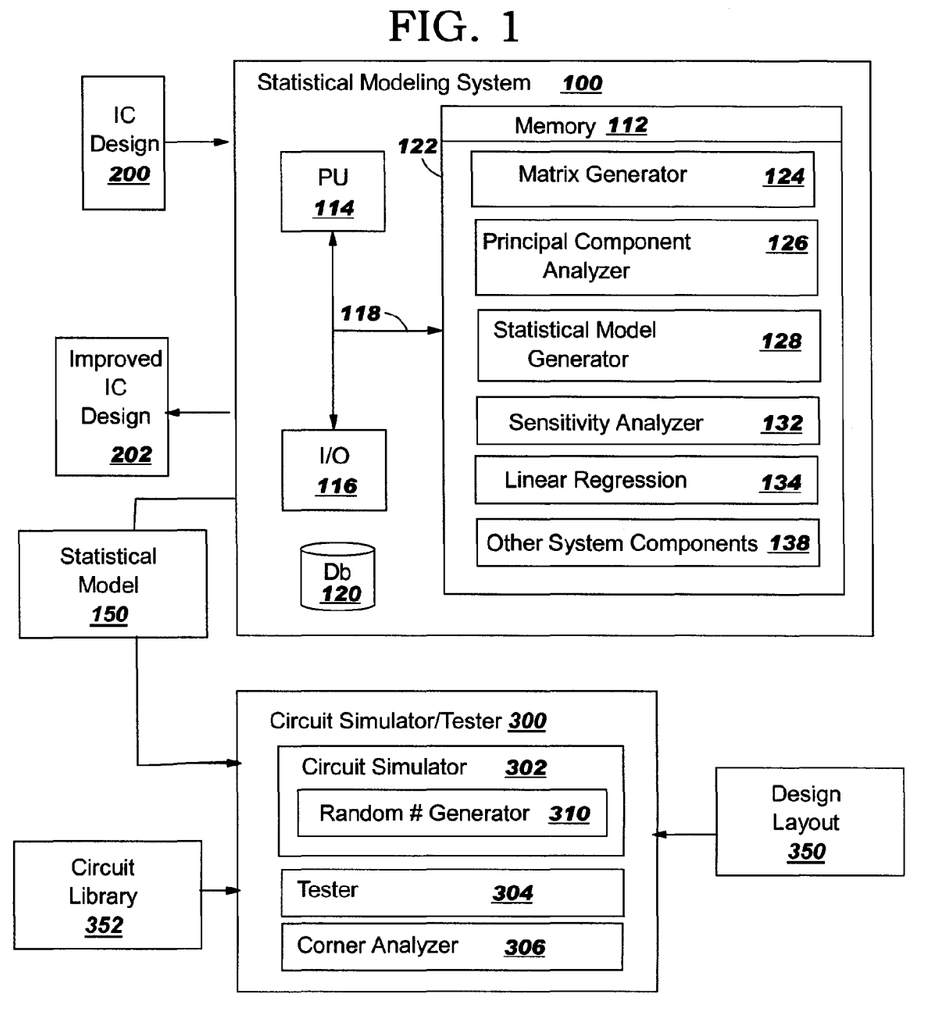
FIG. 1 shows block diagram of a statistical modeling system according to the invention.

With reference to the accompanying drawings, FIG. 1 is a block diagram of an integrated circuit (IC) design statistical modeling system 100 according to one embodiment of the invention. System 100 includes a memory 112, a processing unit (PU) 114, input/output devices (I/O) 116 and a bus 118. A database 120 may also be provided for storage of data relative to processing tasks. Memory 112 includes a program product 122 that, when executed by PU 114, comprises various functional capabilities described in further detail below. Memory 112 (and database 120) may comprise any known type of data storage system, including magnetic media, optical media, random access memory (RAM), read only memory (ROM), a data object, etc. Moreover, memory 112 (and database 120) may reside at a single physical location comprising one or more types of data storage, or be distributed across a plurality of physical systems. PU 114 may likewise comprise a single processing unit, or a plurality of processing units distributed across one or more locations. I/O 116 may comprise any known type of input/output device including a network system, modem, keyboard, mouse, scanner, voice recognition system, CRT, printer, disc drives, etc. Additional components, such as cache memory, communication systems, system software, etc., may also be incorporated into system 110. System 100 receives an IC design 200 to be legalized and outputs a legalized IC design 202. It should be recognized that system 100 may be incorporated as a part of a larger IC design system or be provided as a separate system.

Figure 2:
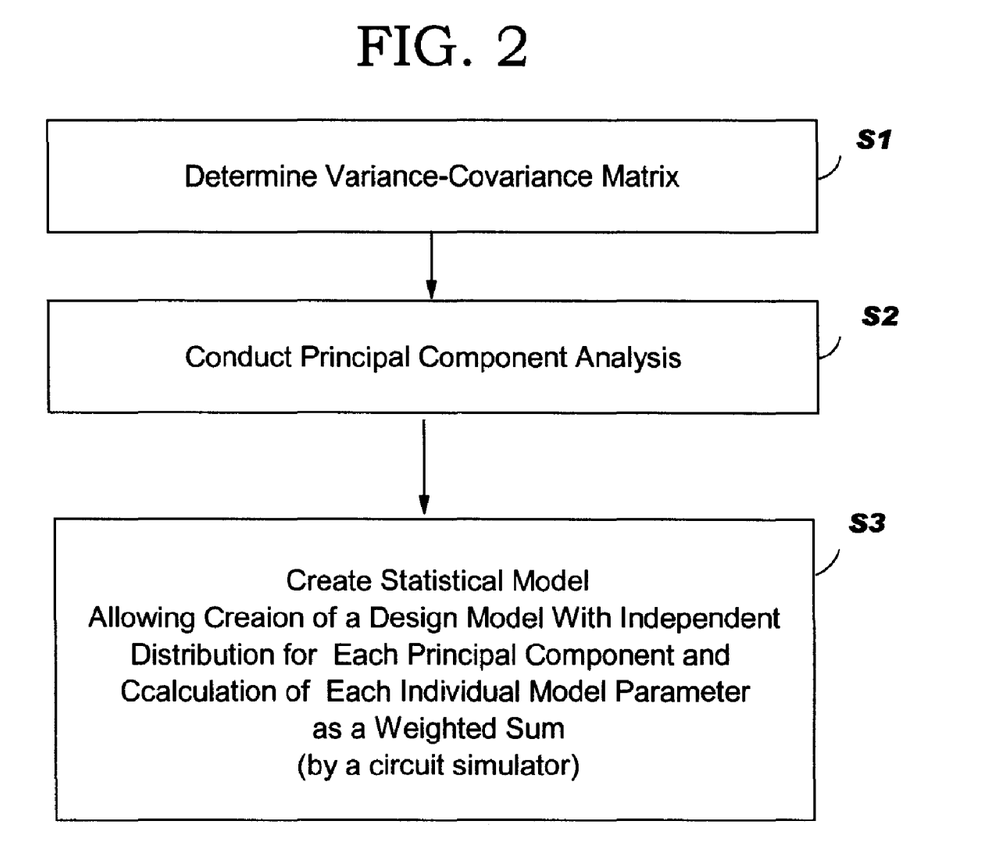
FIG. 2 shows a flow diagram of operational methodology of the system of FIG. 1.

As shown in FIG. 2, program product 122 may include a matrix generator 124, a principal component analyzer 126, a statistical model generator 128, a sensitivity analyzer 132, a linear regression module 134, and other system components 138. Other system components 138 may include any other necessary functionality not expressly described herein.

System 100 outputs a statistical model 150 for use by a circuit simulator/tester 300. A particular circuit simulator/tester 300 may include a circuit simulator 302, a tester 304 and a corner analyzer 306. Circuit simulator 302 may include any commercial simulator such as HSPICE (produced by Synopsis) or proprietary tool such as IBM's PowerSPICE, and includes a random number generator 310. Tester 304 may include any conventional IC testing equipment.

It should be recognized that while system 100 has been illustrated as a standalone system, it may be included as part of a larger IC design system or a peripheral thereto. In addition, as shown, circuit simulator/tester 300 is a separate device from system 100. It should be recognized, however, that circuit simulator/tester 300 can be included as part of system 100, if desired.

II. OPERATIONAL METHODOLOGY

Turning to FIG. 2, a flow diagram of operational methodology according to one embodiment of the invention will now described.

A. Partial Correlation of Variations:

1. Introduction

Some model parameters can be described by a simple independent distribution. In this case, a model parameter is calculated by statistical model generator 128 as its mean value plus a tolerance times a skew parameter: $P_i = P_{i0} + P_{it} * x_i$. The default typical skew value of $x_i$ is zero, giving the parameter its typical value of $P_{i0}$. For Monte Carlo simulation, the values $x_i$ are selected randomly by the simulator giving $P_i$ a random value centered around the typical value. In some cases, two different model parameters vary due to the same physical source of variation. For example, variation in substrate doping causes both a variation in the threshold voltage and in the substrate sensitivity of a FET. This case can be modeled in the same way as a single independent distribution by using the same skew parameter $x_i$ for both parameters: $P_i = P_{i0} + P_{it} * x_i$, and $P_k = P_{k0} + P_{kt} * x_i$. The above two cases represent extremes of model parameter correlation where, in the first case, the correlation coefficient is zero and, in the second case, the correlation coefficient is one or minus one.

It is also possible for parameters to be partially correlated as in the case of NFET and PFET channel length. "Partial correlation," as used herein means the problem in which multiple sources of variation affect a model parameter, but do not necessarily have a direct relationship. For instance, a source of variation may affect multiple model parameters similarly, but another source of variation may affect only one model parameter. It is this situation that the invention addresses. In this case, the variation can be modeled with two distributions. One represents the source of variation, e.g., polysilicon linewidth, which affects multiple parameters in the same way. The second distribution represents source(s) of variation which effect only one parameter, e.g., each transistor's spacer width variation. With the proper selection of $P_{it}$ and $P_{kt}$, the following equations can reproduce the distributions of $P_i$, $P_k$ and $(P_i - P_k)$ regardless of how many dependent and independent physical effects contribute to the observed distribution: $P_i = P_{i0} + P_{it} * x_i + P_{kt} * x_k$, and $P_k = P_{k0} + P_{it} * x_i - P_{kt} * x_k$, where $P_i$ and $P_k$ are two partially correlated parameters, $P_{i0}$ and $P_{k0}$ are the mean values of $P_i$ and $P_k$, $P_{it}$ and $P_{kt}$ are two numbers selected to produce the desired degree of correlation, and $x_i$ and $x_k$ are random numbers with mean of 0 and variance of 1. Where there are more than two types of transistors in a circuit, the distribution can become even more complicated.

2. Model Parameters Directly Measurable

The following description relates to model parameters that can be directly measures. According to the invention, in a first step S1, a variance-covariance matrix is determined by matrix generator 124 for data to be modeled. A "variance-covariance matrix" is a square matrix that includes the variance of each model parameter on the matrix diagonal and the covariance of each model parameter to every other model parameter as the off diagonal elements. In one embodiment, this step includes taking a sufficiently large volume of measured data and determining the matrix using standard statistical calculations. If the manufacturing process to be modeled is mature, then data would be taken on a number of chips representing the full range of process variation. The data would consist of each of the model parameters of interest on each of the chips. Accordingly, the process can handle any number of different transistors. Standard statistical techniques exist to determine the variance-covariance matrix from this data. Where a technology's development is at a point at which process control specifications are being established, conducting this step may not be practical because the volume of data is limited, and existing data may include problems that require some engineering judgment to interpret. In this situation, matrix generator 124 may establish the correlation matrix by examining data for individual parameters and differences between individual parameters. Then, tolerances (control limits) are set on the components and differences. These can be converted to variance and covariance by the following formulas $$\sigma^2_i = (tol_i / 3)^2 \quad (1)$$

$$\sigma^2_{ij} = (\sigma^2_i + \sigma^2_j - (tol_{ij}/3)^2)/2 \quad (2)$$

where $\sigma^2_i$ is a variance of an ith parameter, $tol_i$ is a tolerance (control limit) on the ith parameter, $\sigma^2_{ij}$ is a covariance of the ith parameter to a jth parameter, and $tol_{ij}$ is a tolerance (control limit) on the difference between the ith parameter to the jth parameter. As an example, to model the tracking between threshold voltages of four different FET types NFET, PFET, LVTNFET and LVTPFET, the following tolerances are established: VtNFET, VtPFET, VtLVTNFET, VtLVTPFET, (VtNFET−VtPFET), (VtNFET−VtLVTNFET), (VtNFET−VtLVTPFET), (VtPFET−VtLVTNFET), (VtPFET−VtLVTPFET), (VtLVTNFET−VtLVTPFET).

As noted above, the variance-covariance matrix can be established for any number of partially correlated parameters. For example, three pairs of thin gate oxide FETs with different threshold voltages can be used on the same chip along with two pairs of thicker gate oxide FETs. This gives a total of 10 transistor types, which results in a 10×10 matrix. The partial correlation is illustrated in how the channel lengths of all these types are controlled in part by the polysilicon printing process, in part by processes which are common for only some transistor types and in part by processes which are independent for each transistor type.

In a second step S2, a principal component analysis is conducted by principal component analyzer 128 on the variance-covariance matrix. Analyzer 128 may conduct any conventional principal component analysis, as understood by those with skill in the art. Analyzer 128 finds the eigenvalues of the matrix and the corresponding eigen vectors. The eigenvalues and eigen vectors are used to construct a statistical model 150 coded in a language understood by a particular circuit simulator 302, which calculates each individual model parameter as a weighted sum. As noted above, circuit simulator 302 may be a commercial simulator such as HSPICE (produced by Synopsis) or proprietary tool such as IBMs PowerSPICE.

In a third step S3, statistical model generator 128 generates a statistical model 150 by calculating an independent distribution for each principal component, which allows calculation of each individual model parameter as a weighted sum by simulator/tester 300. That is, the eigenvalues and eigen vectors are used to construct a statistical model 150 coded in a language understood by a particular circuit simulator 302 so that it can generate a design model for simulation of a design layout. As will be described below, circuit simulator/tester 300 may also implement a corner analysis using statistical model 150. As noted above, circuit simulator 302 may be a commercial simulator such as HSPICE (produced by Synopsis) or proprietary tool such as IBM's PowerSPICE.

3. Model Parameters Not Directly Measurable

Figure 3:
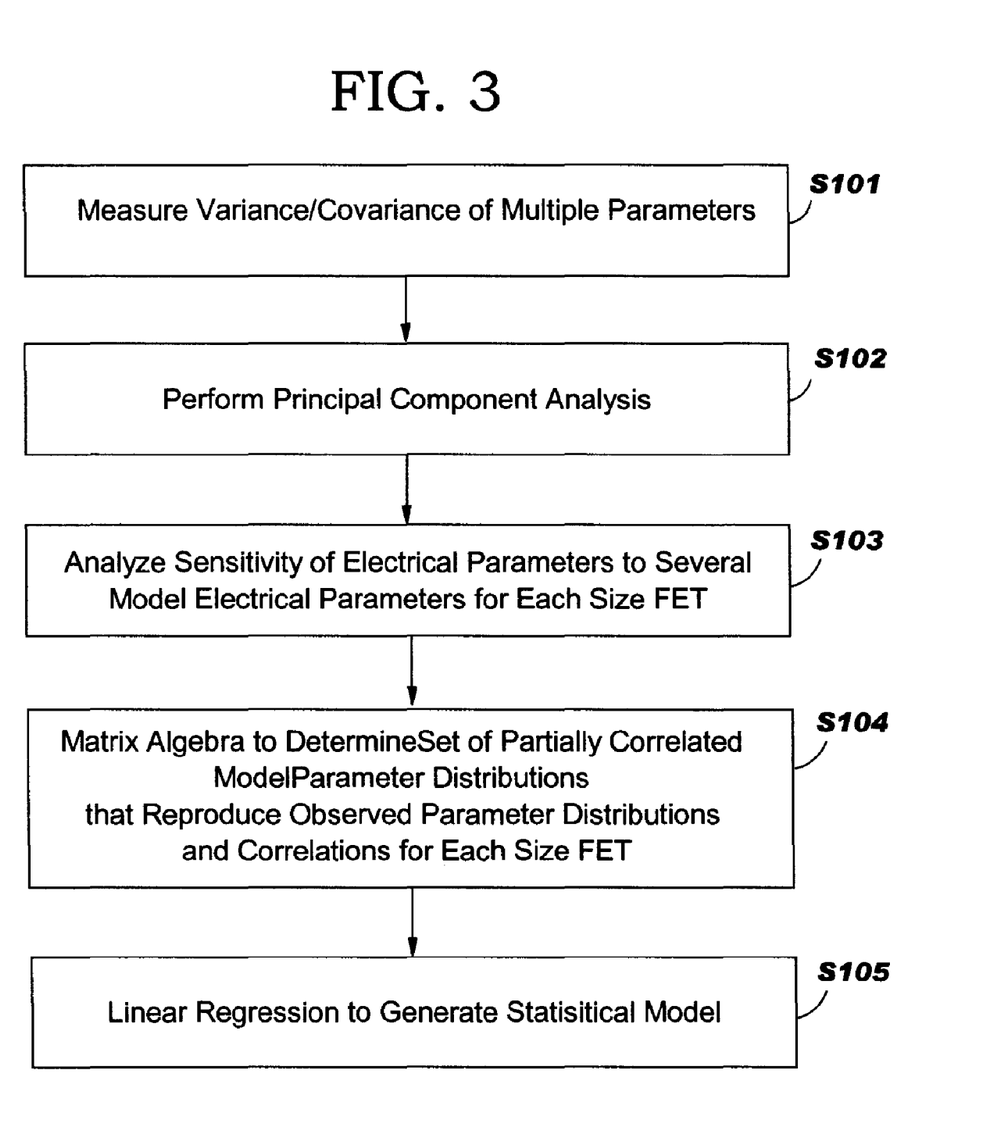
FIG. 3 shows a flow diagram of an alternative embodiment of the method.
Figure 4:
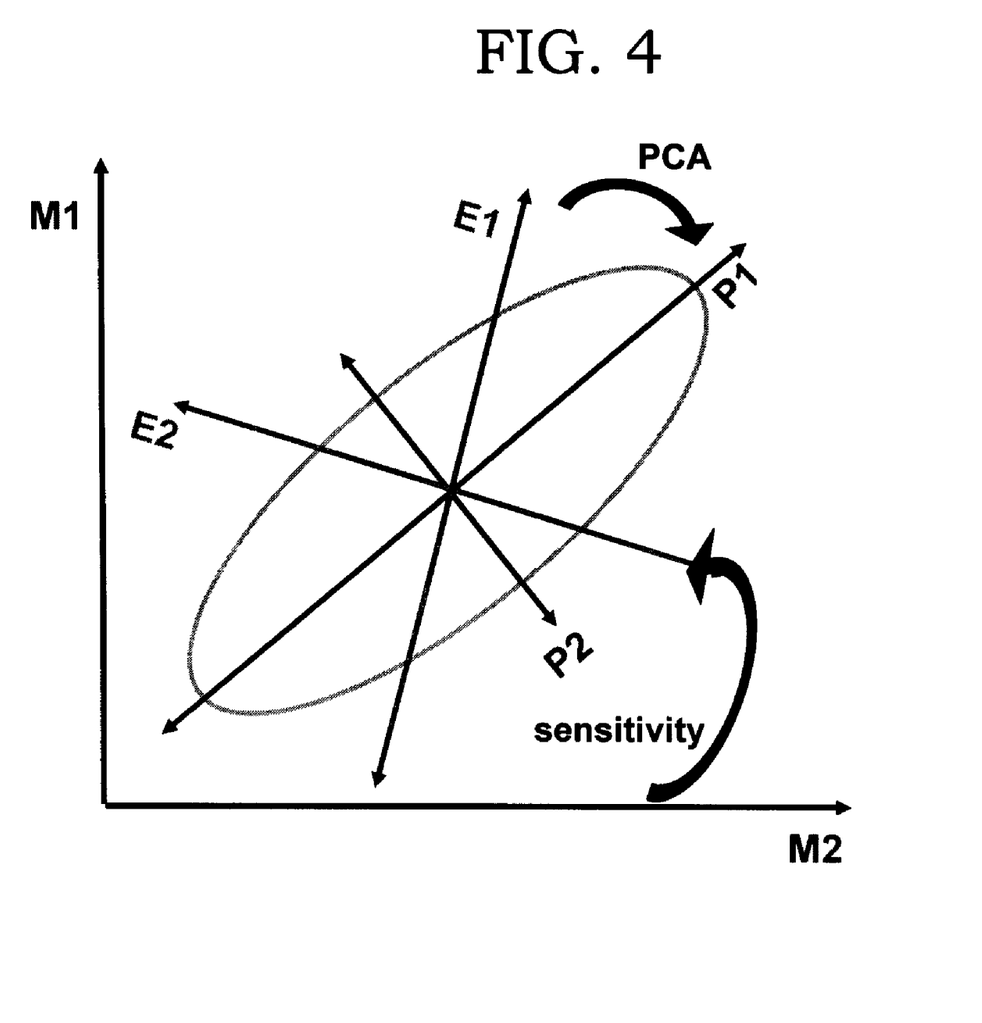
FIG. 4 shows a graphical representation of data for multiple distributions of model parameters.

The FIG. 2 methodology described above relates to generation of a statistical model where model parameters can be directly measured. Referring to FIG. 3, a flow diagram illustrating a method according to the invention addressing the situation where model parameters are not directly measurable is illustrated. In general, the invention implements a method of determining the weights for the statistical model for calculating model parameters when the variance-covariance matrix cannot be determined by measurement. In one embodiment, the FIG. 3 methodology is performed on approximately 15-20 electrical parameters per a FET geometry so that the statistical analysis becomes multivariate. The description here is based on a two dimensional space. Referring to FIG. 4, an ellipsoid is illustrated that represents the actual distribution of the mismatch variation of two electrical parameters E1 and E2. The methodology of FIG. 3 is implemented in order to implement the ellipsoid distribution with a correlation coefficient greater than 0.5 into a spice model for each geometry.

Referring to FIG. 3 in conjunction with FIG. 1, in a first step S101, variance and covariance of multiple electrical parameters are measured for several different size (e.g., length and width) FETs by a tester, e.g., tester 304.

In a second step S102, a principal component analysis is performed for each size FET by principal component analyzer 126 (FIG. 1). In particular, principal component analysis is performed on the mismatch variation of the electrical parameter E1 and E2 (FIG. 4). The principal component analysis determines the directions of independent variation (P1 & P2 in FIG. 4) in terms of the electrical parameters.

In a third step S103, an analysis of the sensitivity of each electrical parameter to a plurality of model electrical parameters for each size FET is performed by sensitivity analyzer 132 (FIG. 1). In one embodiment, a sensitivity analysis is performed of each model electrical parameter to the spice model parameters using spice simulation. When the sensitivities are arranged in a matrix as:

$$[S] = \begin{vmatrix} dVT/dM1 & dVT/dM2 & dVT/dM3 & dVT/dM4 \dots \\ dID/dM1 & dID/dM2 & dID/dM3 & dID/dM4 \dots \\ dGM/dM1 & dGM/dM2 & dGM/dM3 & dGM/dM4 \dots \\ dGD/dM1 & dGD/dM2 & dGD/dM3 & dGD/dM4 \dots \\ dSB/dM1 & dSB/dM2 & dSB/dM3 & dSB/dM4 \dots \end{vmatrix}$$

the matrix can be used to find the direction in electrical parameter space that corresponds to a particular direction in model parameter space: [E]=[S][M].

In a fourth step S104, matrix algebra is used by matrix generator 124 to determine a set of vectors [M] in model parameter space each of which corresponds to one of the principal component directions [P]: $[M]=[S]^{-1}[P]$ Then, in a fifth step S105, linear regression 134 is used to determine the geometric dependence of the model parameter distributions to generate statistical model 150 for the unmeasurable model parameters. That is, the information for all geometries is combined in a single statistical model 150 by linear regression once the matrix [C] is obtained for each geometry. In one embodiment, this step includes performing linear regression 134 for each matrix element, $C_{ij}$, which is the model parameter standard deviation, using the following equation: $C_{ij}$=Coeff/(sqrt(device area)).

Repetitive testing and revision of a circuit design may then occur using circuit simulator/tester 300, as described above.

B. Simulation

1. Partial Correlations

In operation, a circuit simulator 302 calculates each of a plurality of model parameters as a weighted sum based on statistical model 150. As explained above, statistical model 150 is based on a principal component analysis of a variance-covariance matrix for data to be modeled and includes an independent distribution for each principal component. Circuit simulator 302 can then simulate circuit operation using the plurality of model parameters in any conventional fashion.

In one embodiment, a circuit simulator 302 may implement the following equation to calculate the individual model parameters: $P_i = \Sigma x_j v_j e_{ji}$, where $P_i$ is an ith model parameter, $x_j$ is a jth random number generated by random number generator 310, $v_j$ is a square root of a jth eigenvalue, and $e_{ji}$ is an ith component of a jth eigen vector. Random number generator 310 generates as many random numbers as there are partially correlated model parameters. Each model parameter is then calculated as a weighted sum of all the random numbers. In one embodiment, the weights are the product of the eigenvalues and the components of the eigen vectors. In another embodiment, the corresponding elements for each eigen vector are used as the weights for the weighted sum.

Circuit simulator 302 generates random numbers (via a random number generator 310) to set model parameters to set characteristics of different device types, according to the above-described equation. Hence, the model is referred to as a "Monte Carlo model" because random sampling is used to setup an ensemble of problems representative of the distribution of process variable expected during manufacture. Each problem is expressed as a set of coupled algebraic or ordinary differential equations and solved deterministically. The statistical distribution of solutions is taken to be representative of the distribution of circuit characteristics expected from the manufacturing process. A particular circuit simulator 302 translates the random numbers into variations that represent changes in different parameters of a chip that are expected to vary when many chips are fabricated over time using statistical model 150. The random numbers are independent of one another. Conventionally, each random number is multiplied by some factor that is added to a mean to get a value for a model parameter, and only has one distribution coupled to each model parameter. In contrast, a circuit simulator 302 according to the invention can calculate a model parameter as a means plus weighted sum of several different distributions. For example, a distribution for a first model parameter may range from −10 to 10, while the distribution for a second model parameter may range from 1-40. The weighted sums make the variations correlate, even though the distributions are different. Each subsequent model parameter is generated using different weights but the same distribution. In this fashion, model parameters are correlated to one another rather than completely independent of each other. If two parameters are strongly correlated they will both have large weights for one or more of the same distributions and will vary together when that distribution varies. If two parameters are weakly correlated each will have large weights only on distributions where the other has small or zero weights. Because each will move primarily in response to distributions with little effect on the other, they will be nearly independent.

Subsequently to the above simulation by circuit simulator 302, a tester 304 conducts testing using the design model and measures the required parameters and performance. If the circuit design meets design goals, then no other changes are required. Otherwise, the circuit design may be revised and the modeling repeated. Over repeated tests, a user obtains an idea of what statistical change may be expected for each parameter over time during fabrication, e.g., performance, etc.

2. Corner Analysis

Circuit simulation by circuit simulator/tester 300 may also include an optional process in which a corner analysis is completed by corner analyzer 306 using statistical model 150. In this process, corner analyzer 306 may conduct, in conjunction with tester 304, a corner analysis in which each FET type has a corner parameter that varies, for example, threshold voltage (Vt) and channel length independently using statistical model 150. This step allows the user to select matched or mismatched corners in addition to the above-described partially correlated model parameters so as to move all FET channel lengths and widths to fast or slow conditions. In one embodiment, this step is implemented as disclosed in co-pending U.S. Pat. No. 6,606,729, which is hereby incorporated by reference.

Figure 5:
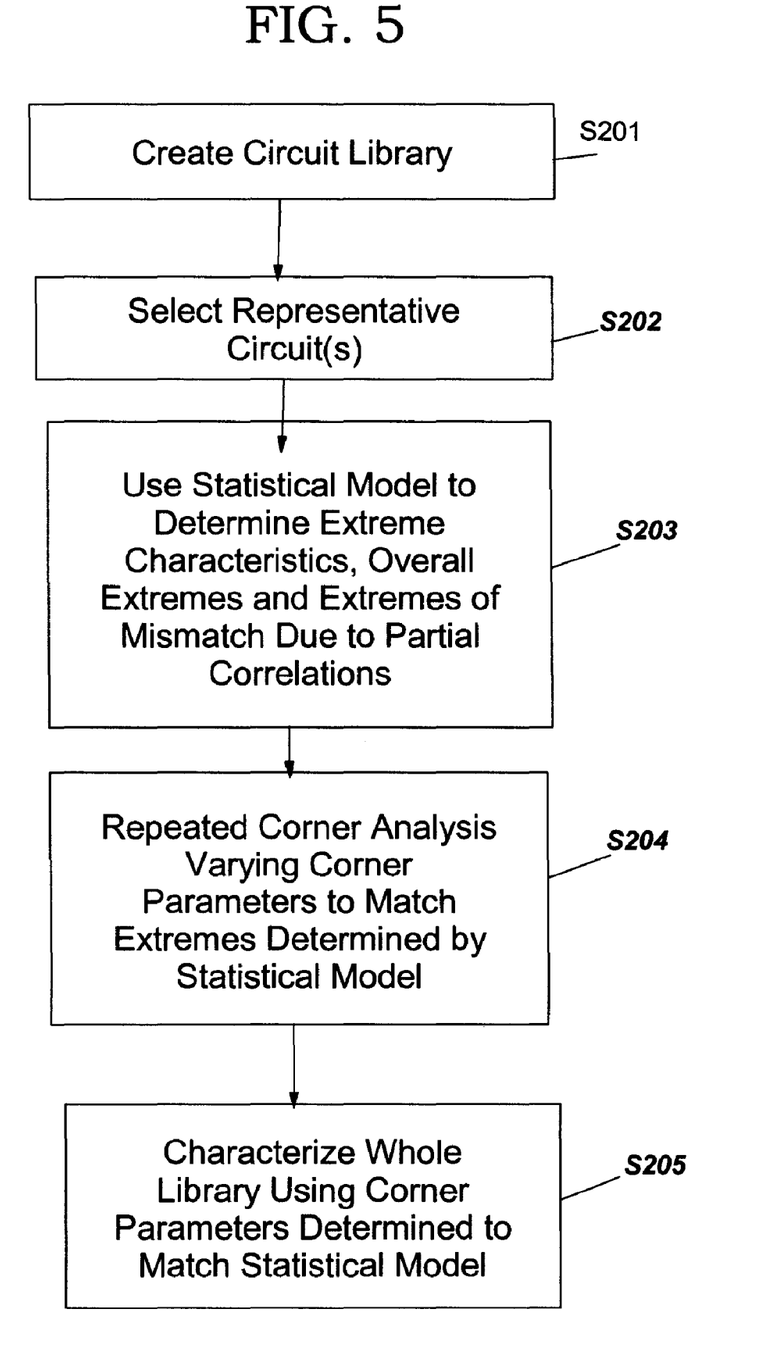
FIG. 5 shows a flow diagram of one embodiment of a method for using a statistical model for conducting a corner analysis.

Referring to FIG. 5 (and FIG. 1), one illustrative embodiment for implementing a corner analysis using statistical model 150 will now be described. In a first step S201, a circuit library 352 is created (or provided) of various circuits usable for particular logic functions. Circuit library is created in any now known or later developed fashion.

In second step S202, representative circuits are selected from the circuit library for analysis. The representative circuits may be any circuits considered by a designer as being representative of a group of circuits within circuit library 352.

In a third step S203, statistical model 150 is used by circuit simulator 302 to determine characteristic extremes, for example, the extreme fast and slow delays due to chip mean variation with all devices matched from one run and the extreme fast and slow delays due to mismatch with the chip mean at nominal.

In step S204, a conventional corner analysis is performed by corner analyzer 306, varying corner parameters to match extremes found using statistical model 150 in step S203.

In step S205, the whole circuit library 352 can be characterized using the corner parameters found to match the statistical model. That is, results of the corner analysis applied to the representative circuits can be applied to characterize each circuit within circuit library 352.

3. Layout Dependent Variations

Two transistors of the same type, designed with the same dimensions will not be identical when actually fabricated because layout dependent variations created during fabrication. To simulate these variations, statistical model 150 along with circuit simulator 302 is capable of adjusting the model parameters on an instance-by-instance basis.

In terms of layout dependent variations, some effects are purely random, i.e., there is no way to predict how any given transistor will vary or the extent to which it will track with any other transistor. These effects are easily modeled by creating a random number (via random number generator 310) on an instance-by-instance basis, and adjusting the relevant parameter, as described above. Other effects are systematic in the sense that by examining the layout it is possible to predict how much a transistor will vary from its typical value. An example is mechanical stress due to shallow trench isolation that causes a variation in carrier mobility and other device characteristics. Some across chip variations are systematic in the sense that instances that share certain layout features will track each other even though prediction of the size and direction of the effect for a specific layout is not possible. An example of this is gate length variation due to the orientation of the line (horizontal vs. vertical). Although lines in the same orientation track each other more closely than orthogonal lines, the magnitude and direction of this effect is random; varying from one photolithography tool to another. According to the invention, this effect is modeled by globally selecting two random values generated by random number generator 310; one for each orientation. In particular, statistical model 150 via circuit simulator 302 accepts an instance parameter indicating the orientation of the device per the random number value generated. In this way, devices with the same orientation get the same random adjustment, track each other correctly, and have the correct total variation. For pre-physical design simulation, circuit simulator 302 randomly assigns an orientation for each device.

Another slightly different example of a layout dependent variation is the random variation in the number of dopant atoms in the FET body. This effect is completely random from FET to FET, but the magnitude of the variation depends on gate area. According to the invention, this effect is modeled with a unique random number generated by random number generator 310 for each device scaled to the proper size for the device dimensions.

In order to address the above-described situation, in one alternative embodiment, statistical model 150 provides circuit simulator 302 with instance parameters for layout dependent variations. For example, it is known that FET gates print with different lengths if the orientation is different. This effect is systematic on a single chip, i.e., all FETs of a vertical orientation will have the same offset to all FETs of horizontal orientation. However, before the mask is made and the chip printed, this offset's magnitude and sign are unknown. So, for design purposes the value of the offset is random but it is applied systematically across the chip. Then, circuit simulator 302 controls random pieces based on particular instances—knows correlations based on instances. Alternatively, circuit simulator 302 defaults to a third value if the parameter is not specified. In particular, during modeling, random number generator 310 creates two random values for use on a global basis. All FETs specified as horizontal get one of these random values, and all FETs specified as vertical get the other random value. FETs with the default setting randomly select one or the other of these values on a local basis. The result is that for layouts where orientation is control FETs will track each other closely and the total variation in channel length will include the known effect of the orientation offset. If the layout includes FETs of both orientations the effect of tracking between particular pairs of FET will be correctly modeled. For pre-physical design simulations where orientation is not known, the possible effects of random orientation are correctly modeled. In addition, global switch is available to turn off the layout dependent variations individually so there impact can be quantified individually or to reflect the fact that all FET will be oriented the same as the channel monitoring device effectively eliminated variation for this effect.

For corner simulation, a single across chip variation extreme value (corner) parameter moves all across chip effects together. This causes a problem because if each component moves by its full magnitude, the sum will exceed the sum expected from the random number generation. This is because several independent distributions will not all be worst case at the same time. To correct for this situation, the distributions must be scaled in corner simulations. And the scaling must be adjusted to account for the use of switches to null some sources of variation. In this case, circuit simulator 302 implements the following formula to achieve this: Scale= $(\Sigma \sigma_i^2 s_i)^{1/2}/(\Sigma \sigma_i s_i)$, where $s_i$ is switch and $\sigma_i$ is the tolerance for the ith component of across chip variations.

III. CONCLUSION

In the previous discussion, it will be understood that the method steps discussed are performed by a processor, such as PU 114 of system 100, executing instructions of program product 122 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of statistically modeling integrated circuits on a computer system using model parameters that are directly measurable and not directly measurable, the method comprising:
    wherein for the case that the model parameter is directly measurable, the method further comprises:
        determining a variance-covariance matrix for data to be modeled;
        conducting principal component analysis on the variance-covariance matrix; and
        creating a statistical model with an independent distribution for each principal component, allowing calculation of each individual model parameter as a weighted sum; and
    wherein for the case that the model parameter is not directly measurable, the method further comprises:
        measuring a variance and covariance of multiple electrical parameters for a plurality of different size transistors;
        conducting a principal component analysis for each size transistor;
        analyzing a sensitivity of each model electrical parameter to a plurality of model parameters for each size transistor and recording model parameter distributions;
        determining a set of partially correlated model parameter distributions that reproduce the recorded model parameter distributions; and
        conducting a linear regression to determine a geometric dependency of the model parameter distributions to generate the statistical model.

2. The method of claim 1, wherein the matrix determining includes implementing the following formulas: $\sigma^2_i=(tol_i/3)^2$, and $\sigma^2_{ij}=(\sigma^2_i+\sigma^2_j-(tol_{ij}/3)^2)/2$, is a variance of an ith parameter, $tol_i$ is a tolerance on the ith parameter, $\sigma^2_{ij}$ is a covariance of the ith parameter to a jth parameter, and $tol_{ij}$ is a tolerance on the difference between the ith parameter to the jth parameter.

3. The method of claim 1, wherein the weighted sum is an eigenvalue of a corresponding element.

4. A computer system for statistically modeling integrated circuits using model parameters that are directly measurable and not directly measurable, the computer system comprising:
    at least one processing unit;
    memory operably associated with the at least one processing unit; and
    a statistical modeling system storable in memory and executable by the at least one processing unit, the statistical modeling system comprising:
        wherein for the case that the model parameter is directly measurable:
            a matrix generator that determines a variance-covariance matrix for data to be modeled;
            a principal component analyzer that conducts principal component analysis on the variance-covariance matrix; and
            a statistical model generator that creates a statistical model with an independent distribution for each principal component, allowing calculation of each individual model parameter as a weighted sum; and
        wherein for the case that the model parameter is not directly measurable:
            a tester measures a variance and covariance of multiple electrical parameters for a plurality of different size transistors;
            the principal component analyzer conducts a principal component analysis for each size transistor;
            a sensitivity analyzer analyzes a sensitivity of each model electrical parameter to a plurality of model parameters for each size transistor and recording model parameter distributions;
            the matrix generator determines a set of partially correlated model parameter distributions that reproduce the recorded model parameter distributions; and
            a linear regression conducts a linear regression module to determine a geometric dependency of the model parameter distributions to generate the statistical model.

5. The computer system of claim 4, wherein the matrix generator implements the following formulas: $\sigma^2_i=(tol_i/3)^2$, and $\sigma^2_{ij}=(\sigma^2_i+\sigma^2_j-(tol_{ij}/3)^2)/2$, where $\sigma^2_i$ is a variance of an ith parameter, $tol_i$ is a tolerance on the ith parameter, $\sigma^2_{ij}$ is a covariance of the ith parameter to a jth parameter, and $tol_{ij}$ is a tolerance on a difference between the ith parameter to the jth parameter.

6. The computer system of claim 4, wherein the weighted sum is an eigenvalue of a corresponding element.

7. A computer program product comprising a computer useable medium having computer readable program code embodied therein, which when executed, enables a computer system to statistically model integrated circuits using model parameters that are directly measurable and not directly measurable, the program product comprising:
  wherein for the case that the model parameter is directly measurable, the program code is configured to:
    program code configured to determine a variance-covariance matrix for data to be modeled;
    program code configured to conduct a principal component analysis on the variance-covariance matrix; and
    program code configured to create a statistical model with an independent distribution for each principal component, allowing calculation of each individual model parameter as a weighted sum; and
  wherein for the case that the model parameter is not directly measurable, the program code is configured to:
    measure a variance and covariance of multiple electrical parameters for a plurality of different size transistors;
    conduct a principal component analysis for each size transistor;
    analyze a sensitivity of each model electrical parameter to a plurality of model parameters for each size transistor and recording model parameter distributions;
    determining a set of partially correlated model parameter distributions that reproduce the recorded model parameter distributions; and
    conduct a linear regression to determine a geometric dependency of the model parameter distributions to generate the statistical model.

8. The program product of claim 7, wherein the matrix determining code includes program code configured to implement the following formulas: $\sigma^2_i = (tol_i/3)^2$, and $\sigma^2_{ij} = (\sigma^2_i + \sigma^2_j - (tol_{ij}/3)^2)/2$, where $\sigma^2_i$ is a variance of an ith parameter, $tol_i$ is a tolerance on the ith parameter, $\sigma^2_{ij}$ is a covariance of the ith parameter to a jth parameter, and $tol_{ij}$ is a tolerance on the difference between the ith parameter to the jth parameter.

9. The program product of claim 7, wherein the weighted sum is an eigenvalue of a corresponding element.

* * * * *

UNITED STATES PATENT AND TRADEMARK OFFICE
CERTIFICATE OF CORRECTION

PATENT NO.        : 7,640,143 B2                                    Page 1 of 1
APPLICATION NO.   : 10/904307
DATED             : December 29, 2009
INVENTOR(S)       : Bittner et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1389 days.

Signed and Sealed this

Ninth Day of November, 2010

David J. Kappos
*Director of the United States Patent and Trademark Office*